United States Patent [19]

Rossi et al.

[11] Patent Number: 5,682,100
[45] Date of Patent: Oct. 28, 1997

[54] SYSTEM AND METHOD FOR LOCATING FAULTS IN ELECTRIC POWER CABLES

[75] Inventors: John F. Rossi, Mendham; Michael H. Silverberg, Livingston; Garrett S. Sylvester, Mountain Lakes; Jack F. Trezza, Hopatcong, all of N.J.; David Robert Smith, McKeesport, Pa.

[73] Assignee: Electric Power Research Institute Inc., Palo Alto, Calif.

[21] Appl. No.: 524,033

[22] Filed: Sep. 6, 1995

[51] Int. Cl.$^6$ ............................................. G01R 31/08
[52] U.S. Cl. .................. 324/535; 324/532; 324/539; 324/536; 361/111
[58] Field of Search ........................... 324/532, 535, 324/617, 539, 536; 361/111

[56] References Cited

U.S. PATENT DOCUMENTS

| | | | |
|---|---|---|---|
| 2,717,992 | 9/1955 | Weintraub | 324/535 |
| 2,752,526 | 11/1956 | Strinfigel | |
| 3,462,681 | 8/1969 | Biskup | 324/535 |
| 3,609,533 | 9/1971 | Pardis | 324/535 |
| 4,500,834 | 2/1985 | Ko et al. | |
| 5,070,537 | 12/1991 | Ohira et al. | |
| 5,083,086 | 1/1992 | Steiner | |
| 5,138,265 | 8/1992 | Kawamura | 324/532 |
| 5,416,418 | 5/1995 | Maureira | 324/532 |

FOREIGN PATENT DOCUMENTS

| | | | |
|---|---|---|---|
| 215970 | 9/1986 | Japan | 324/532 |
| 215971 | 9/1986 | Japan | 324/532 |
| 142286 | 6/1993 | Japan | 324/532 |

OTHER PUBLICATIONS

Street, "Delivery and Application of Precise Timing for a Traveling Wave Powerline Fault Locator System", 22nd Annual Precise Time and Time Interval Application and Planning Meeting, 1990.

Wilson, "Methods and Uses of Precise Time in Power Systems", Transactions on Power Delivery, vol. 7, No. 1, Jan. 1992.

Dewe et al, "The Application of Satellite Time References to HVDC Fault Location", IEEE Transactions on Power Delivery, vol. 8, No. 3, Jul. 1993.

*Primary Examiner*—Ernest F. Karlsen
*Assistant Examiner*—Jose M. Solis
*Attorney, Agent, or Firm*—Flehr Hohbach Test Albritton & Herbert LLP

[57] ABSTRACT

There is provided a system and method for locating faults in power distribution systems with complex topology, such as multi-phase urban networks (6), utilizing reliable time-delay techniques as well as a transponder (22) at a monitoring point to sense the arrival of the transient fault pulse and for transmitting a timing pulse a known time delay after sensing the arrival of the transient fault pulse and a calibration pulse a known time delay after transmitting the timing pulse. Installed along the power distribution system at key locations are receiver stations (4, 4a, 4b) capable of sensing the arrival of the transient fault pulse, timing pulse and calibration pulse and measuring the time intervals occurring between each. The location of the fault is then determined based on these timing intervals, known time delays and the known propagation velocity of the electric power cables in the power distribution system. Fault location accuracy is further enhanced by factoring rise-time effects of the sensed pulses into the time interval measurements.

20 Claims, 5 Drawing Sheets

RISE-TIME TABLE FOR
4,000 VOLT PULSE INJECTED
AT MONITORING POINT AND
RECEIVED AT RECEIVING POINTS

| Receiver Station | Rise-Time (nano-seconds) |
|---|---|
| 4 | 2,000 |
| 4a | 1,763 |
| 4b | 2,234 |

FIG. 6

RISE-TIME TABLE FOR SUBSTATION 8

FOR BREAKDOWN VOLTAGE = 1,000 VOLTS
AND SENSOR THRESHOLD = VOLT

| Disance to Fault (feet) | Rise-Time (nano-seconds) |
|---|---|
| 1,000 | 4 |
| 1,500 | 7 |
| 2,000 | 10 |
| 2,450 | 13 |
| 3,000 | 17 |
| 3,300 | 19 |

FIG. 7

SYSTEM AND METHOD FOR LOCATING FAULTS IN ELECTRIC POWER CABLES

BACKGROUND OF THE INVENTION

1. Field of the Invention

The present invention relates to a system and method of locating faults in electric power cables and, more particularly, to locating insulation defect type faults occurring in multi-phase urban networks and underground residential distribution (URD) systems by time measuring.

2. Description of the Related Art

Detection systems currently available for locating faults in electric power cables are either unreliable or expensive when applied to power distribution systems with complex topology, such as multi-phase urban networks or underground residential distribution (URD) systems.

There are two well known techniques presently available for remotely locating faults in electric power cables: reflectometry and time-delay analysis. The reflectometry technique measures the time difference between the arrival of the first pulse and its subsequent reflections from the fault at one end of the line. The location of the fault is calculated by the following equation $$\text{location of fault} = \tfrac{1}{2} v_o (T_2 - T_1)$$

where $v_o$ is the propagation velocity, $T_1$ is the arrival time of the first surge and $T_2$ is the arrival time of the reflection. Note that the factor two appears in the equation because the surge must travel to the impedance discontinuity and back.

This technique cannot be relied upon for accuracy under all possible fault conditions because typical electric power cables have impedance discontinuities distributed along their length which can cause reflections, i.e., clutter, large enough to mask the presence of the reflection from the fault. This is true particularly in power distribution systems, such as urban networks, which have multiple cables branched along its length.

The second technique, time-delay analysis, is more reliable for locating faults because clutter problems, particularly within complex networks, are avoided. This technique is based on measuring the time difference in the arrival of the fault-generated pulse at each end of the cable and applying the following equation $$\text{location of fault} = \tfrac{1}{2} L (1 - ((T_2 - T_1)/\tau))$$

where $L$ is the total length of the cable line, $T_1$ is the surge arrival time at the near end, $T_2$ is the surge arrival time at the far end, and $\tau$ is the travel time of the entire line. This technique can be applied as the fault occurs or after the fault occurs. Applying the time-delay technique as the fault occurs is referred to as "real-time" analysis. The time-delay technique can be applied "after the fact" to locate insulation defect type faults and it involves the additional step of applying a high voltage to the cable to "break down" the insulation defect and induce a transient fault pulse to propagate through the cable.

The accuracy of this time-delay technique is heavily dependent on the provisions of a common time reference to both ends of the cable. A system known as "Time Transfer System" is currently being used to provide the common time reference using a satellite to transmit a reference signal to receiver units on the ground. A ground station controls the satellite signal and maintains a reference time to a high degree of accuracy so that users receiving this signal can synchronize clocks over a wide geographical area. The most accurate of these time transfer systems is the "Global Positioning System" (GPS) which, for civilian use, can provide time synchronization to an accuracy of less than one micro second. This synchronization accuracy allows a fault location accuracy of ±300 meters. Since the typical GPS receiver unit is relatively expensive, fault detection techniques utilizing GPS time transfer systems have limited potential and are mainly used on power transmission systems with simple topology, such as overhead lines. Applying this technique to power distribution systems with complex topology would require many GPS receivers and can be prohibitively expensive.

For the foregoing reasons, there is a need for a system and method for locating faults in power distribution systems with complex topology, such as multi-phase urban networks, utilizing reliable time-delay techniques with relatively inexpensive equipment.

SUMMARY OF THE INVENTION

In the present invention, a method for locating the position of a fault in a multi-phase power distribution system as the fault occurs is taught utilizing reliable time-delay techniques and yet relatively inexpensive apparatus. The method includes the steps of injecting a timing pulse into the multi-phase power distribution system at a monitoring point along the multi-phase power distribution system a known time delay after sensing the arrival of a transient fault pulse at the monitoring point; measuring the timing intervals at each of a plurality of receiving points along the multi-phase power distribution system between the arrival of the transient fault pulse and the timing pulse; and determining the location of the fault along the multi-phase power distribution system based on the timing intervals measured at the receiving points, the time delay interposed at the monitoring point, and the known propagation velocities of the electric power cables in the power distribution system. This method can be implemented to locate insulation defect type faults in single phase or multi-phase power distribution systems after the occurrence of the fault by applying a high voltage discharge into the electric power cable, as taught in the prior art, of sufficient strength to "break down" the insulation defect and induce a transient fault pulse.

The apparatus for carrying out the above-described method includes a first means for sensing the arrival of the transient fault signal at the monitoring point; a means for injecting timing and calibration pulses responsive to the first sensing means into the power distribution system at the monitoring point; a time delay means at the monitoring point for interposing a delay of a specific known time interval before injecting the timing and calibration pulses after sensing the arrival of the transient fault signal; second means for sensing the arrival of the transient fault pulse and the injected pulses at each of the plurality of receiving points along the power distribution system; and a means for measuring time intervals responsive to the second sensing means occurring between sensing the arrival of the transient fault pulse and the injected pulses at the receiving points. The means for measuring time intervals comprise a counter clocked by an oscillator. The time intervals are recorded or sent to a control center for analysis. Also included are means for applying a high voltage supply into the power distribution system to "break down" insulation type defect faults and induce a transient fault pulse after the occurrence of the insulation defect.

Advantageously, the calibration pulses injected by the present invention are received at the receiving points along the power distribution system and are used to verify the operational accuracy of the oscillators at each of the receiving points. Calibration time intervals are measured at the receiving points between sensing the arrival of the timing pulse and calibration pulse and are recorded or sent to a control center for analysis. These calibration time intervals are used to calibrate inaccurate oscillators at the receiving points.

Also in accordance with this invention, fault location accuracy is further enhanced by utilizing rise-time calculations. Rise-time calculations take into account the time period between the actual arrival time of a pulse and the time the pulse was detected by the sensor to obtain more precise measurements of the pulse arrival time. More precise measurements of pulse arrival times gives a more accurate location of the fault.

These and other features, aspects, and advantages of the present invention will become better understood with regard to the following description, appended claims, and accompanying drawings.

BRIEF DESCRIPTION OF THE DRAWINGS

FIG. 6 shows a sample rise-time table for a 4,000 volt pulse injected at substation 8 and sensed at each of the receiver stations by a sensor having a threshold level of 1 volt.

FIG. 7 shows a sample substation 8 rise-time table for a fault having a breakdown voltage of 1,000 volts and a sensor at substation 8 having a threshold level of 1 volt.

DETAILED DESCRIPTION OF THE INVENTION

Figure 1:
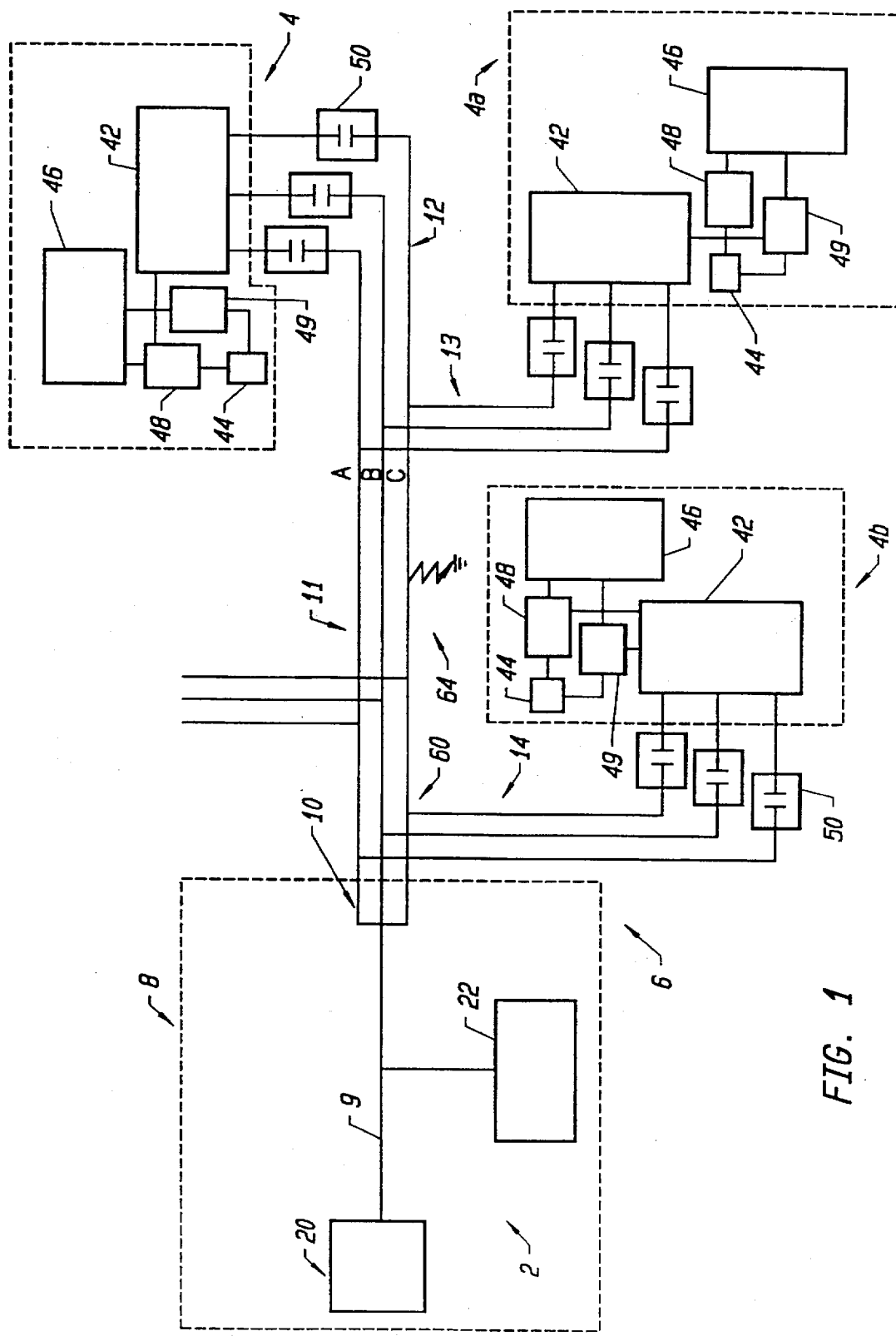
FIG. 1 shows a schematic representation of a fault location system for a multi-phase urban network in accordance with this invention.

As shown in FIG. 1, the fault location system comprises test equipment 2 and receiver stations 4, 4a and 4b electrically connected to an urban network 6 comprised of phases A, B and C. An insulation defect 64 is shown occurring on phase C of branch 11, although it should be understood that the present invention is capable of locating insulation defects occurring anywhere along the urban network 6. For urban networks and underground residential distribution (URD) systems, insulation defects are the typical type of faults encountered. The present invention can locate an insulation defect in single or multi-phase power distribution systems either as it occurs or after its occurrence. For other fault types such as short circuits or open circuits, the present invention can locate them in multi-phase power distribution systems as they occur.

The test equipment 2 is preferably portable and is electrically connected to the urban network 6 at a monitoring point, such as substation 8. The test equipment 2 comprises a hipot 20 and a transmitter/receiver 22. The hipot 20 is a high voltage supply and is electrically connected by a cable 9 to branch 10. The hipot 20 is capable of applying a high voltage supply into the urban network 6 to "break down" the insulation defect 64 and induce a rapid rise transient fault pulse to propagate through the urban network 6 after the breakdown of the insulation defect 64. The hipot 20 is not necessary to the present invention when fault location analysis is being implemented as the fault occurs, i.e., real-time analysis. With real-time analysis, the present invention will utilize the transient fault pulse resulting from the occurrence of the fault, thus eliminating the need for the hipot 20 to induce a subsequent fault.

Electrically connected either directly or indirectly to the urban network 6 between the hipot 20 and branch 10 is the transmitter/receiver 22, also referred to herein as transponder 22. If the coupling is inductive, transponder 22 is connected at least one hundred feet from the hipot 20 to avoid reflections off the open end of the cable 9. The transponder 22 comprises a sensor capable of sensing the transient fault pulse, a transmitter for injecting high amplitude pulses into the urban network 6, and a time delay mechanism for interposing a time interval before transmitting a pulse after another pulse was either sensed or transmitted. The time delay mechanism can either be fixed or approximate. If it is the former, then the time delay interposed before transmitting the pulse must be a precise and constant interval. If the time delay mechanism is approximate, a means for measuring the time delay, not shown, is electrically connected to the transponder 22 and comprises a counter clocked by a highly accurate oscillator, not shown. The oscillator is preferably accurate to at least twenty nano seconds. In another embodiment of the invention, a separate sensor, transmitter and counter are used in lieu of the transponder 22.

Receiver stations 4, 4a and 4b are permanently installed at selected receiving points, such as at the end of major branches 12, 13 and 14, respectively, along the urban network 6, as shown in FIG. 1. Each receiver station comprises a sensor 42, a first counter 48, a second counter 49, an oscillator 44 and communication means 46. The sensors 42 are electrically connected to the branches 12, 13 and 14 preferably through capacitor test ports 50. The sensors 42 are capable of sensing the transient fault pulse and high amplitude pulses transmitted from the transponder 22. First and second counters 48 and 49 are electrically connected to sensors 42 and are triggered and stopped by sensors 42. In another embodiment of the invention, a single sensor capable of measuring multiple time intervals is used. First and second counters 48 and 49 are clocked by oscillators 44. Electrically connected to first and second counters 48 and 49 are the communication means 46. The time intervals measured by the first and second counters 48 and 49 may be downloaded via communication means 46 to the substation 8 or a control center, not shown, for fault location analysis.

The present invention is initiated when it senses the arrival of the transient fault pulse. If fault location analysis is performed after the occurrence of the insulation defect 64, the transient fault pulse is induced by a high voltage supply applied into branch 10 by the hipot 20. The voltage level of the hipot 20 is slowly raised until breakdown voltage is attained, i.e., voltage sufficient to "break down" the insulation defect 64. When this occurs, a rapid rise transient fault pulse is induced at the insulation defect 64 and propagates along phase C of branch 11 in both directions away from the insulation defect 64. If fault location analysis is being implemented as the insulation defect 64 occurs in the urban network 6, the transient fault pulse produced by the occurrence of the fault makes the step of inducing a subsequent transient fault pulse "after the fact" with a high voltage supply unnecessary.

There are three pulses of pertinence to the present invention: pulse 1 is the transient fault pulse travelling from the fault to the transponder 22; pulse 2 is the transient fault pulse travelling from the fault to the sensor 42; and pulse 3 is a high amplitude timing pulse travelling from the transponder 22 to the sensors 42.

Figure 2:
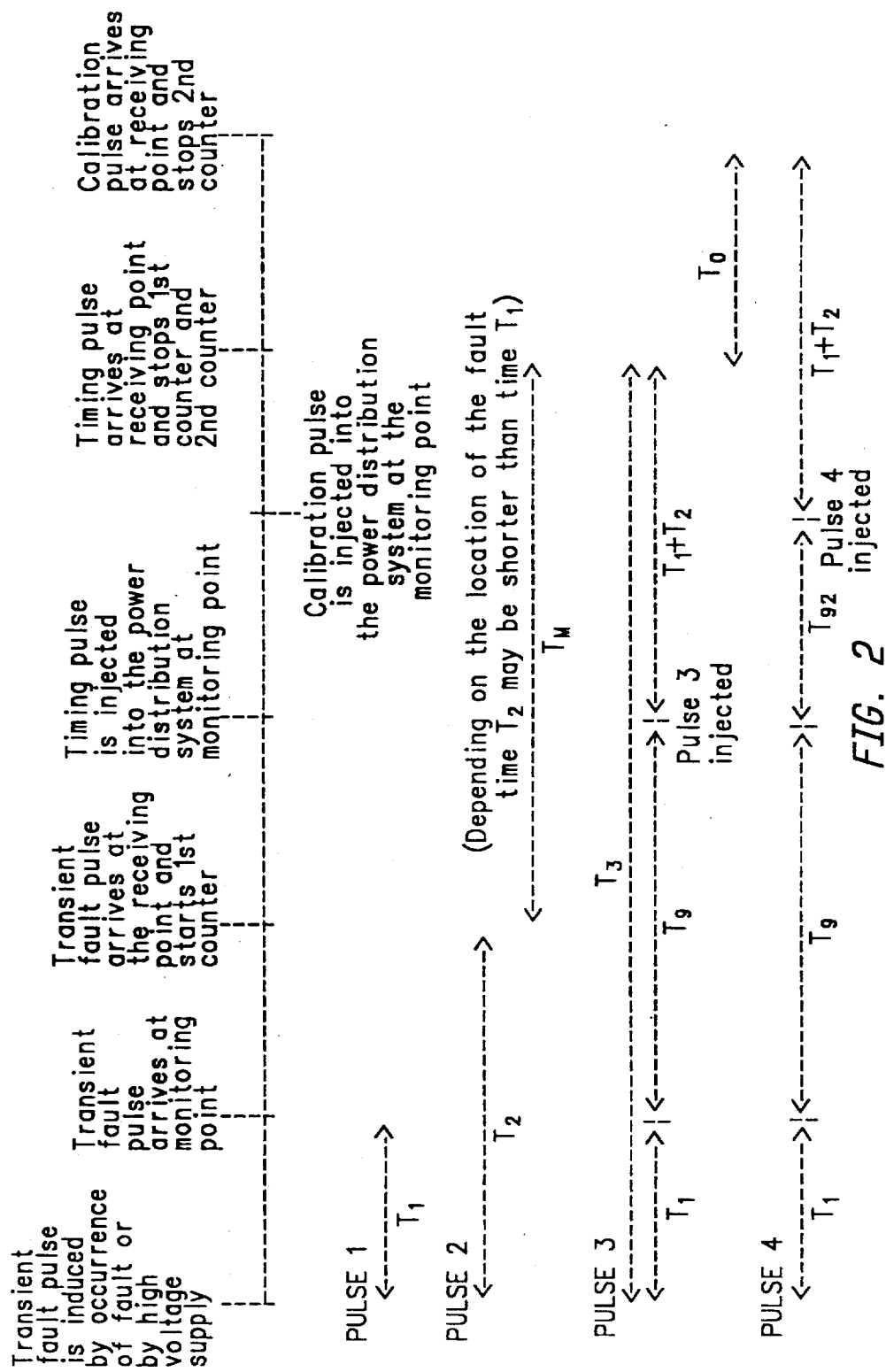
FIG. 2 shows a pulse time interval diagram depicting the pulse sequence and time intervals following creation of a transient fault pulse for a fault on the direct path between the monitoring point and the receiving point.

With reference to FIG. 2 as well as FIG. 1, pulse 1 arrives at the test equipment 2 and is sensed by the transponder 22 once it rises above a pre-determined threshold level at a time $T_1$ after the transient fault pulse was induced. Pulse 3 is injected into the branch 10 by transponder 22 a known time delay $T_D$ after sensing the arrival of pulse 1.

For clarity of discussion, the events occurring at the receiver stations 4, 4a and 4b will be described with reference to the receiver station 4. Note that in FIG. 1 the insulation defect 64 occurs along the direct path between the test equipment 2 and the receiver station 4.

Pulse 2 is received by the receiver station 4 where it is sensed by its respective sensor 42 once it rises to the threshold level a time $T_2$ after the transient fault pulse was induced. It should be understood that time $T_2$ at the receiver stations 4, 4a and 4b will be dependent upon the propagation rate of the transient fault pulse and the distance traveled. Upon sensing pulse 2, the sensor 42 triggers its first counter 48 to start counting. When the arrival of pulse 3 is sensed, the sensor 42 signals the first counter 48 to stop. The first counter 48 measures the time difference between sensing the arrival of pulse 2 and pulse 3, which is the measured timing interval $T_M$.

Referring in particular to FIG. 2, the first counter 48 begins counting at time $T_2$ after the transient fault pulse was induced and stops counting when pulse 3 is sensed by the sensor 42. The time it takes for pulse 3 to be sensed by the sensor 42 after the transient fault pulse was induced is $T_3$, which is the sum of the time it takes pulse 1 to travel from the insulation defect 64 and be sensed by the transponder 22 ($T_1$), the time delay ($T_D$) interposed between sensing the arrival of pulse 1 and transmitting pulse 3, and the time it takes pulse 3 to travel from the transponder 22 and be sensed by sensor 42 ($T_1+T_2$).

Thus, $$T_M = T_3 - T_2$$

Substituting for $T_{TP}$ (which equals "$T_1+T_D+T_1+T_2$") and solving for $T_1$, $$T_1 = (T_M - T_D)/2 \qquad \text{(equation 1)}$$

Using known propagation velocities of the electric power cables in the urban network 6 and the time $T_1$ it takes for pulse 1 to travel from the insulation defect 64 and be sensed by the transponder 22, the location of the insulation defect 64 can be determined using the equation $$x = v_o T_1 \qquad \text{(equation 2)}$$

where "x" is the distance the insulation defect 64 is from the test equipment 2 and $v_o$ is the average propagation velocity of the electric power cables along the direct path of the insulation defect 64 and the test equipment 2. The propagation velocities of the electric power cables are determined prior to the occurrence of the insulation defect.

Figure 3:
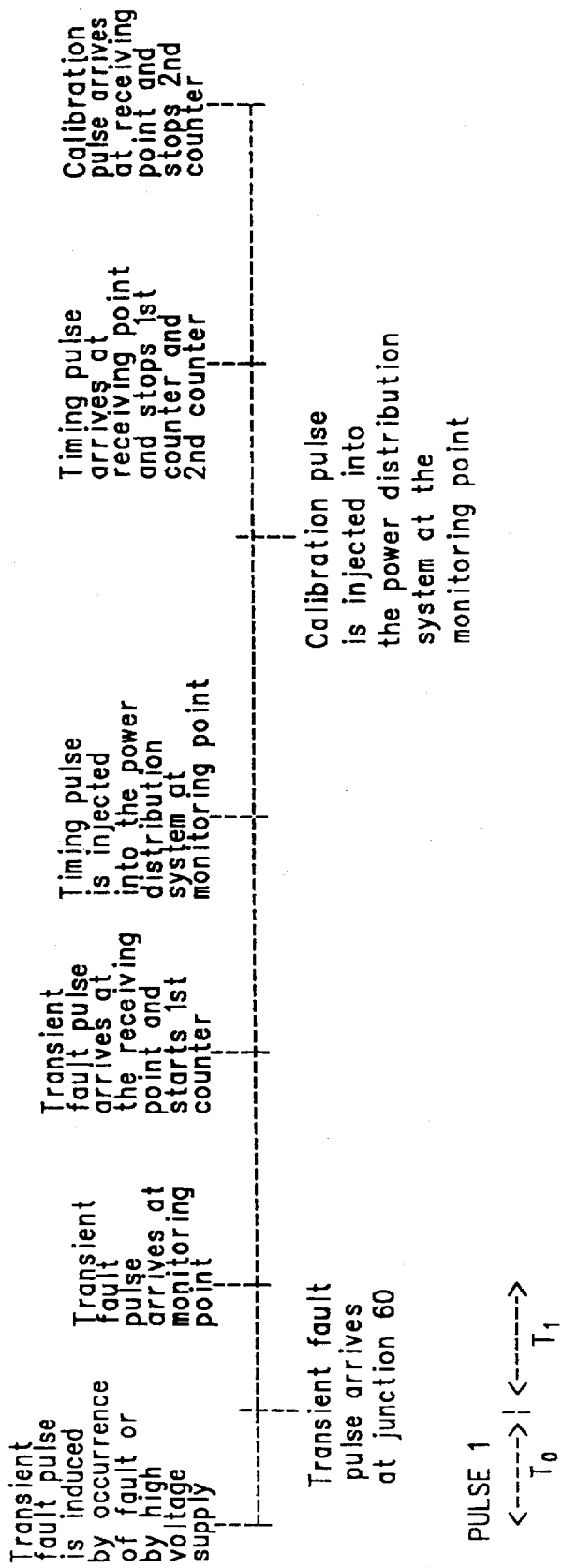
FIG. 3 shows a pulse time interval diagram depicting the pulse sequence and time intervals following creation of a transient fault pulse for a fault beyond the direct path between the monitoring point and the receiving point.

However, using the timing interval $T_M$ measured at any receiving point will not always provide the exact location of the insulation defect 64. In the situation where the insulation defect 64 does not occur on the direct path of the test equipment 2 and any receiver station, but rather the insulation defect 64 occurs on a branch beyond the direct path, the time $T_1$ will represent how long it takes pulse 1 to travel from the test equipment 2 to the junction of the direct path and the branch where the insulation defect 64 resides. This situation can best be illustrated by referring to receiver station 4b in FIG. 1 and to FIG. 3. The insulation defect 64 is not located on the direct path between the test equipment 2 and the receiver station 4b, but rather on phase C of branch 11 which is connected to the direct path at the junction 60. Solving for $T_1$ using the timing interval $T_M$ measured at the receiver station 4b will give the time it takes for pulse 1 to travel from the junction 60 to the test equipment 2. The time it takes pulse 1 to travel from the junction 60 to the insulation defect 64 is $T_o$.

To determine the location of the insulation defect 64 in the urban network 6, you must analyze the timing intervals $T_M$ measured at each of the receiver stations 4, 4a and 4b. The timing interval $T_M$ will always be shorter for those receiver stations with the insulation defect 64 located on a branch beyond its direct path with the test equipment 2. Thus, as a general rule, the location of the insulation defect 64 is determined by using the largest timing interval $T_M$ measured from all the receiver stations in equation 1.

The present invention, advantageously, does not require highly accurate oscillators 44 to be installed at each of the receiver stations. Inaccuracies in any of the oscillators 44 can be calibrated with a calibration pulse (hereinafter referred to as "pulse 4") injected into the urban network 6 at the monitoring point by transponder 22 of equal amplitude to pulse 3 a specific known time delay $T_{D2}$ (also referred herein as calibration time delay) after the injection of pulse 3, as shown in FIG. 2. Calibration time intervals $T_C$ are measured by second counters 49 at the receiver stations 4, 4a and 4b. The second counters 49 are triggered when the arrival of pulse 3 is sensed by their respective sensors 42. Second counters 49 are stopped when their respective sensors 42 sense the arrival of pulse 4.

Since time delay $T_{D2}$ is a known quantity, time delay $T_{D2}$ can be used to calibrate each of the oscillators 44 by comparing it to the calibration time intervals $T_C$. If the oscillators 44 are accurate, then the measured calibration time interval $T_C$ will equal the known time delay $T_{D2}$. When the calibration time interval $T_C$ measured does not equal the time delay $T_{D2}$, then the timing interval $T_M$ measured must be calibrated to compensate for measurement errors caused by the inaccurate oscillator 44 at the respective receiver station. Calibration enhances the accuracy level of the present invention in locating faults while keeping the cost of the present invention relatively inexpensive by not requiring expensive accurate oscillators to be installed at every receiver station. For example, when the time delay $T_{D2}$ is 1.00 seconds but the calibration time interval $T_C$ measured is 1.10 seconds, then the time interval $T_M$ measured must be calibrated by 10% otherwise the location of the fault will be inaccurate by 10%. Thus, if the measured timing interval $T_M$ was 0.55 seconds, the calibrated timing interval $T_M$ would be 0.50 seconds.

The above described system and method of the present invention can also be applied to locate other types of faults in multi-phase power distribution and to locate insulation defect type faults in single phase power distribution systems. For faults in multi-phase power distribution systems other than insulation defects, the present invention must utilize real-time analysis. Thus the transponder 22 must be installed at the monitoring point when the fault occurs to sense the transient fault pulse induced by the occurrence of the fault. The hipot 20 is unnecessary to the present invention in this situation since there is no longer a need to produce a subsequent transient fault pulse "after the fact."

The present invention can locate insulation defect type faults in single phase power distribution systems as the insulation defect occurs or after its occurrence. When the present invention is applied in this situation, the timing and calibration pulses transmitted by the transponder 22 must have a lower amplitude than the breakdown voltage so not to induce another transient fault pulse.

To assist in determining the location of a fault in the urban network 6, a pre-fault survey is taken to measure the travel time from the substation 8 to key locations throughout the urban network 6, such as end points of major branches and junctions. The travel times may be converted to physical locations. Comparing the time $T_1$ to the survey allows quick and efficient determination of where the fault is located. For example, if the survey reveals that the travel times from the substation 8 to junctions 60 and 62 are 2 and 4 seconds, respectively, and the time $T_1$ is 2.5 seconds, it can quickly be determined that the fault is located one-fourth of the distance along the branch 11.

Figures 4, 5:
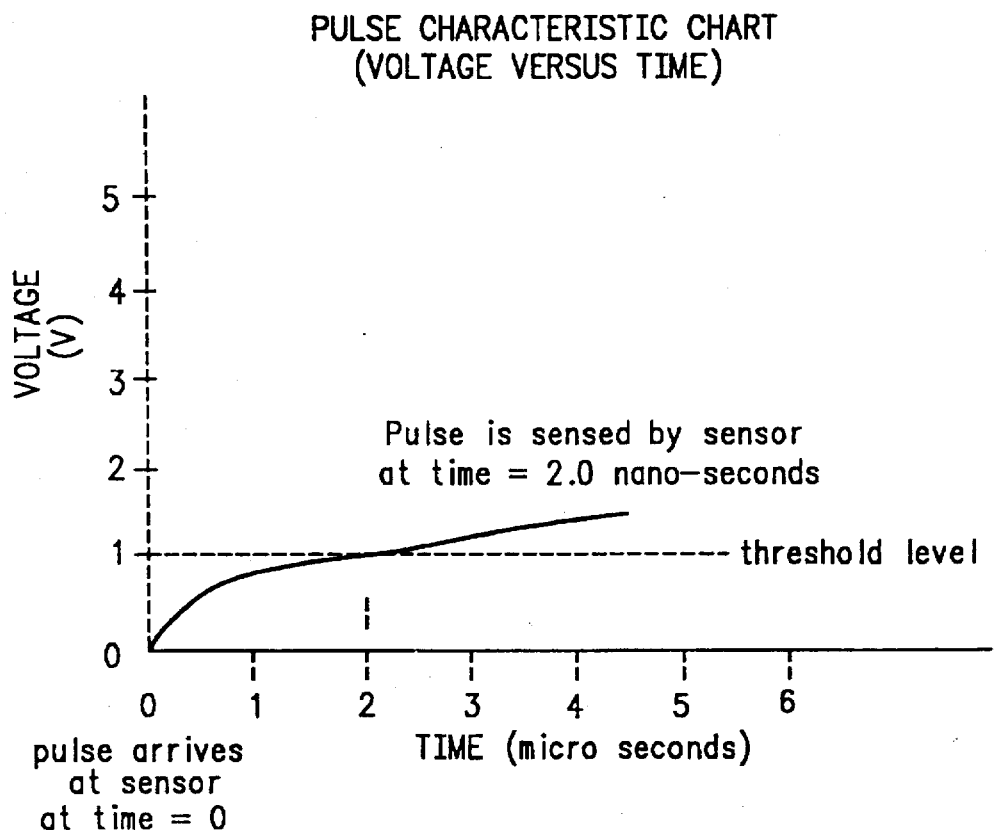
FIG. 4 shows a pulse characteristic chart measuring voltage against time as the pulse arrives at a sensor.
FIG. 5 shows a sample receiver station 4 rise-time table for a fault having a breakdown voltage of 1,000 volts and a sensor at receiver station 4 having a threshold level of 1 volt.

As shown in FIG. 4, a period called "rise-time" occurs between the arrival of a pulse and when it is sensed at the threshold level by the sensors 42 or transponder 22. A rapid rise-time pulse injected into a cable will experience continual reduction in its rate of rise as it travels along the cable. The reduction will be greater for cables with higher conductor resistance and higher insulation dissipation. Thus, the rate of rise of pulses 1, 2, 3 and 4 will depend upon the path traveled. The path lengths of pulses 1 and 2 are variable and dependent upon the location of the fault while the path lengths of pulses 3 and 4 are fixed. Preferably, pulses 3 and 4 will have the same rate of rise because they are preferably pulses of equal amplitude traveling the same path.

Accounting for rise-time provides more precise measurements of pulse arrival times and can further improve the accuracy of the present invention in locating faults. Fault location methods and systems currently available do not account for rise-time effects when calculating fault location. The present invention does account for the effects of rise-time. In any case, rise-time effects can be minimized without performing rise-time calculations by having low threshold settings consistent with the noise level for the sensors 42 and transponder 22.

The present invention accounts for rise-time effects by utilizing rise-time tables and performing iterative fault location calculations based on a tentative fault location. Rise-time tables for a nominal voltage, sensor threshold level and a number of fault locations are prepared for pulse 1 at the monitoring point and pulse 2 at each of the receiving points. Rise-times tables are prepared with the aid of oscilloscopes, not shown, electrically connected at the monitoring point and receiving points. A fault is simulated by positioning a spark gap, not shown, having a known breakdown voltage a known distance from the monitoring point. A high voltage supply is then applied to the urban network 6 to "break down" the spark gap and induce a transient fault pulse. The oscilloscopes record the transient fault pulse voltage characteristics over time, as shown in FIG. 4, as it arrives at the monitoring point and each of the receiving points. The rise-time values are determined from the oscilloscope readings for a nominal threshold level. Since the path length of the transient fault pulse is dependent on the location of the fault, this method is repeated for a number of fault locations throughout the urban network 6 for the same breakdown voltage and nominal threshold level. The rise-time values are compiled in rise-time tables. For example, FIG. 5 shows a sample receiver station 4 rise-time table for a fault having a breakdown voltage of 1,000 volts and a sensor at receiver station 4 having a threshold level of 1 volt. The rise-time table depicts a fault 2,000 feet from the monitoring point will produce a transient fault pulse having a rise-time of 100 nano seconds at receiver station 4.

The path length of pulse 3 is fixed and is independent of the fault location. The rise-time table for pulse 3 is prepared by injecting a high amplitude pulse at the monitoring point and reading the rise-time values from the oscilloscopes at each of the receiving points. As shown in FIG. 6, the rise-time value for a high amplitude pulse of 4,000 volts traveling from the monitoring point to receiver station 4 is 2,000 nano seconds.

The next step is to perform iterative fault location calculations. This step begins by first computing a tentative fault location using equations 1 and 2 and assuming the rise-time value for each pulse to be zero. The tentative fault location is used as a basis for approximating the rise-time of the pulses at each of the receiving points and the monitoring point. The difference in rise-time values between pulse 3 and pulse 2 at the same receiving point based on the tentative location of the fault is subtracted from the timing interval $T_M$ measured at the same receiving point giving an updated timing interval $T_M$. Likewise, the rise-time effect of pulse 1 at the monitoring point is accounted for by adding the rise-time value to the time delay $T_D$ interposed between sensing pulse 1 and injecting pulse 3. The fault location is re-calculated based on the updated timing interval $T_M$ and time delay $T_D$. These calculations are then repeated for the updated fault location. The number of times these calculations are repeated will depend on the desired accuracy level sought to be attained. For example, the insulation defect 64 is "broken down" by a 1,000 volt supply and the transient fault pulse is detected by the sensor 42 at receiver station 4 having a threshold level of 1 volt. The tentative fault location is computed to be 2,000 feet from the monitoring point. From the tables in FIGS. 5 and 6, the rise-time values of pulses 2 and 3 are 100 and 2,000 nano seconds, respectively. The measured timing interval $T_M$ is reduced by the difference in rise-time values between pulse 2 and 3, which is 1,900 nano seconds. From the table in FIG. 7, the rise-time value of pulse 1 is 10 nano seconds. The time delay $T_D$ is updated by adding this rise-time value to it. The location of the fault is re-calculated based on the updated timing interval $T_M$ and time delay $T_D$ to get an updated fault location. The rise-time calculations are repeated for the updated fault location.

For a different breakdown voltage or sensor threshold level than the ones used to create the rise-time tables, rise-time values can be interpolated by assuming a linear rate of rise. For pulses with a linear rate of rise, the rise-time value is inversely proportional to the breakdown voltage and directly proportional to the threshold level. Based on this assumption, the rise-time value can be interpolated for any breakdown voltage and threshold level. For example, 2,000 volts is required to "break down" a fault having a tentative location of 2,000 feet from the monitoring point. From FIG. 5, the rise-time values for pulse 2 is 100 nano seconds for a fault having a breakdown voltage of 1,000 volts. Assuming a linear rate of rise, the rise-time value is interpolated to be one half (i.e., 1000/2000) of 100 nano seconds, or 50 nano seconds. Likewise if the sensor threshold level is twice that of the rise-time table's threshold, then the rise-time value in the table will be doubled. More sophisticated methods are possible if one is able to measure and/or compute realistic rising pulse shapes.

The measured time intervals $T_M$ and $T_C$ from each receiver station are relayed to the monitoring point or a control center by communication means 46 so the fault can be located performing the necessary comparisons and calculations with the aforementioned equations, known propagation velocities of the affected branches, and rise-time effects.

The previously described present invention has many advantages, including the following listed below.

The reliable time-delay analysis technique is being applied to locating faults, as opposed to unreliable reflectometry, in a power distribution system having complex topology, such as multi-phase urban networks and underground residential distribution (URD) systems. The problems the reflectometry technique have with clutter due to reflections are avoided.

Synchronized clocks are not required at both ends of the cable being tested to accurately locate the fault. Costly equipment, such as GPS receivers, are not needed at each receiver station to accurately synchronize the clocks installed along the power distribution system. If synchronized clocks were used in urban networks to locate faults, a GPS receiver would be required at each end of the many major branches in urban networks making the fault location system prohibitively expensive.

Costly highly accurate oscillators do not need to be permanently installed at each and every receiver station. The present invention interposes a specific known time delay $T_C$ at the monitoring point between transmitting the timing and calibration pulses. This time delay $T_C$ is used to check the oscillators at the receiver stations and calibrate the timing intervals $T_M$.

Arrival times of the pulse, as opposed to the sensing times of the pulses, are used by the present invention to enhance the precision in the fault location calculations. Arrival times are determined by subtracting the rise-time value based on a tentative fault location from the time the pulses were sensed by the sensors and/or transponder and iteratively re-calculating the fault location. For longer cables and/or higher threshold settings, the rate of rise has a more profound effect on the accuracy of the sensed arrival times of pulses.

Although the present invention has been described in considerable detail with reference to a certain preferred version thereof, other versions are possible. For example, the method and apparatus described herein are applicable to single phase power distribution systems. Therefore, the spirit and scope of the appended claims should not be limited to the description of the preferred version contained herein.

We claim:

1. A method for locating a fault occurring in a multi-phase power distribution system, such system comprising an urban network with multiple cables branched along its length from a predetermined monitoring point and utilizing receipt of a transient fault pulse induced by the occurrence of said fault to initiate a locating sequence comprising the steps of:
   a. injecting into said multi-phase power distribution system at said monitoring point along said multi-phase power distribution system a timing pulse a known time delay ($T_D$) after the arrival of said transient fault pulse at said monitoring point;
   b. measuring separate timing intervals ($T_m$) between arrival times at each of a plurality of receiving points located on a plurality of said branched cable of said multi-phase power distribution system of said transient fault pulse and said timing pulse; and
   c. determining location of said fault on one of said branched cables of said multi-phase power distribution system based on said timing intervals ($T_m$), said known time delay ($T_D$) and known propagation velocities of electric power cables within said multi-phase power distribution system.

2. The method of claim 1 further comprising the steps of:
   d. putting into said multi-phase power distribution system at said monitoring point a calibration pulse a known calibration time delay ($T_{D2}$) after said injection of said timing pulse;
   e. measuring separate calibration time intervals ($T_C$) between arrival times at each of said plurality of receiving points of said timing pulse and said calibration pulse; and
   f. calibrating said timing intervals ($T_M$) before determining said location of said fault utilizing said calibration time intervals ($T_C$) and said calibration time delay ($T_{D2}$).

3. The method of claim 2 further comprising the step of:
   g. utilizing rise-times of said transient fault pulse, said timing pulse and said calibration pulse based on said location of said fault to update said timing intervals ($T_M$) and said calibration time intervals ($T_C$) and to re-determine said location of said fault based on said updated timing intervals ($T_M$) and said updated calibration time intervals ($T_C$).

4. The method of claim 3 further comprising the step of:
   h. communicating said timing intervals ($T_M$) and calibration time intervals ($T_C$) to a control center for determining the location of said fault in said multi-phase power distribution system.

5. The method of claim 2 further comprising the step of:
   g. communicating said timing intervals ($T_M$) and calibration time intervals ($T_C$) to a control center for determining the location of said fault in said multi-phase power distribution system.

6. The method of claim 1 further comprising the step of:
   d. utilizing rise-times of said transient fault pulse and said timing pulse based on said location of said fault to update said timing intervals ($T_M$) and to re-determine said location of said fault based on said updated timing intervals ($T_M$).

7. The method of claim 6 further comprising the step of:
   e. communicating said timing intervals ($T_M$) to a control center for determining the location of said fault in said multi-phase power distribution system.

8. The method of claim 1 further comprising the step of:
   d. communicating said timing intervals ($T_M$) to a control center for determining the location of said fault in said multi-phase power distribution system.

9. The method of claim 1 wherein the location of said fault is determined utilizing the equations $T_1=(T_M-T_D)/2$ and $x=v_o T_1$, where $T_1$ is the time necessary for said transient fault pulse to travel from said fault to said monitoring point, $T_M$ is the largest time interval measured at any of said receiving points, $T_D$ is the known time delay, x is the distance said fault is from said monitoring point, and $v_o$ is the known average propagation velocity of said electric power cables in said multi-phase power distribution system.

10. A method for locating an insulation defect type fault occurring in a multi-phase power distribution system, such system comprising an urban network with multiple cables branched along its length from a predetermined monitoring point, said method comprising the steps of:

a. applying a high voltage supply into said multi-phase power distribution system sufficient to break down an insulation defect and induce a transient fault pulse;

b. injecting into said multi-phase power distribution system at said monitoring point along said multi-phase power distribution a timing pulse a known time delay ($T_D$) after the arrival of said transient fault pulse at said monitoring point;

c. measuring separate timing intervals ($T_m$) between arrival times at each of a plurality of receiving points located on a plurality of said branched cables of said multi-phase power distribution system of said transient fault pulse and said timing pulse; and d. determining the location of said insulation defect on one of said branched cables of said multi-phase power distribution system based on said timing intervals ($T_m$), said known time delay ($T_D$) and known propagation velocities of electric power cables within said multi-phase power distribution system.

11. The method for locating an insulation defect type fault occurring in a multi-phase power distribution system after the occurrence of said insulation defect as recited in claim 10 further comprising the additional steps of:

e. putting into said multi-phase power distribution system at said monitoring point a calibration pulse a known calibration time delay ($T_{D2}$) after said injection of said timing pulse;

f. measuring separate calibration time intervals ($T_C$) between arrival times at each of said plurality of receiving points of said timing pulse and said calibration pulse; and g. calibrating said timing intervals ($T_M$) before determining said location of said fault utilizing said calibration time intervals ($T_C$) and said calibration time delay ($T_{D2}$).

12. The method of claim 11 further comprising the step of:

h. utilizing rise-times of said transient fault pulse, said timing pulse and said calibration pulse based on said location of said fault to update said timing intervals ($T_M$) and said calibration time intervals ($T_C$) and to re-determine said location of said fault based on said updated timing intervals ($T_M$) and said updated calibration time intervals ($T_C$).

13. The method claim 12 further comprising the step of:

i. communicating said timing intervals ($T_M$) and calibration time intervals ($T_C$) to a control center for determining location of said fault in said multi-phase power distribution system.

14. The method of 11 further comprising the step of:

i. communicating said timing intervals ($T_M$) and calibration time intervals ($T_C$) to a control center for determining location of said fault in said multi-phase power distribution system.

15. The method of claim 10 further comprising the step of:

e. utilizing rise-times of said transient fault pulse and said timing pulse based on said location of said fault to update said timing intervals ($T_M$) and to re-determine said location of said fault based on said updated timing intervals ($T_M$).

16. The method of claim 15 further comprising the step of:

f. communicating said timing intervals ($T_M$) to a control center for determining location of said fault in said multi-phase power distribution system.

17. The method of claim 10 further comprising the step of:

e. communicating said timing intervals ($T_M$) to a control center for determining location of said fault in said multi-phase power distribution system.

18. The method of claim 10 wherein location of said insulation defect is determined utilizing the equations $T_1 = (T_M - T_D)/2$ and $x = v_o T_1$, where $T_1$ is the time necessary for said transient fault pulse to travel from said insulation defect to said monitoring point, $T_M$ is the largest time interval measured at any of said receiving points, $T_D$ is the known time delay, x is the distance said insulation defect is from said monitoring point, and $v_o$ is the known average propagation velocity of said electric power cables in said multi-phase power distribution system.

19. A system for locating a fault in a multi-phase power distribution system as said fault occurs, such system comprising an urban network with multiple cables branched along its length from a predetermined monitoring point, said system comprising:

a. a first means for sensing the arrival of a transient fault signal at a monitoring point along said multi-phase power distribution system;

b. a means for injecting pulses at said monitoring point into said multi-phase power distribution responsive to said first means for sensing;

c. a time delay means at said monitoring point for interposing a delay of a specific known time interval before injection of said pulses after sensing the arrival of said transient fault pulse;

d. second means for sensing the arrival of said transient fault pulse and said injected pulse at each of a plurality of receiving points located on said branched cables along said multi-phase power distribution system; and e. a means for measuring time intervals responsive to said second sensing means occurring between sensing the arrival of said transient fault pulse and said injected pulses at each of said plurality of receiving points.

20. A system for locating an insulation defect in a multi-phase power distribution system after the occurrence of said insulation defect, such system comprising an urban network with multiple cables branched along its length from a predetermined monitoring point, said system comprising;

a. a means for applying a high voltage supply into said multi-phase power distribution system sufficient to break down said insulation defect and induce a transient fault signal;

b. a first means for sensing the arrival of said transient fault signal at a monitoring point along said multi-phase power distribution system;

c. a means for injecting pulses at said monitoring point into said multi-phase power distribution responsive to said first means for sensing;

d. a time delay means at said monitoring point for interposing a delay of a specific known time interval before injection of said pulses after sensing the arrival of said transient fault pulse;

e. second means for sensing the arrival of said transient fault pulse and said injected pulse at each of a plurality of receiving points located on a plurality of said branched cables along said multi-phase power distribution system; and f. a means for measuring time intervals responsive to said second sensing means occurring between sensing the arrival of said transient fault pulse and said injected pulses at each of said plurality of receiving points.

\* \* \* \* \*